United States Patent
Shiino et al.

[19]

[11] Patent Number: 5,867,531
[45] Date of Patent: Feb. 2, 1999

[54] MAXIMUM LIKELIHOOD SEQUENCE ESTIMATOR AND MAXIMUM LIKELIHOOD SEQUENCE ESTIMATING METHOD

[75] Inventors: Haruhiro Shiino; Norio Yamaguchi; Toshimichi Naoi, all of Tokyo, Japan

[73] Assignee: Oki Electric Industry Co., Ltd., Tokyo, Japan

[21] Appl. No.: 604,833

[22] Filed: Feb. 22, 1996

[30] Foreign Application Priority Data

Mar. 9, 1995 [JP] Japan ................................ 7-049922
Jan. 16, 1996 [JP] Japan ................................ 8-004714

[51] Int. Cl.$^6$ ............................................. H04L 5/12
[52] U.S. Cl. ........................ 375/262; 375/341; 371/43.6
[58] Field of Search ................................. 375/262, 341, 375/227, 228, 317, 340, 377; 371/41, 43.6, 43.7, 43.8

[56] References Cited

U.S. PATENT DOCUMENTS

| 4,197,500 | 4/1980 | Klein et al. | 375/347 |
| 5,251,233 | 10/1993 | Labedz et al. | 375/343 |
| 5,271,042 | 12/1993 | Borth et al. | 375/341 |

OTHER PUBLICATIONS

B. Sklar; Channel Coding: Part 2; Digital Communications, Prentice Hall, 1988, pp. 314–338.

Joachim Hagenauer and Peter Hoeher; A Viterbi Algorithm with Soft–Decision Outputs and its Applications; Proceedings of Globecom '89, 1989 IEEE, pp. 1680 –1686.

J.G. Proakis; Maximum–Likelihood Sequence Estimation for Detection of ISI–Corrupted Signals and CPM Signals; Digital Communications, New York, McGraw–Hill, 1983, pp. 610–627.

*Primary Examiner*—Don N. Vo
*Attorney, Agent, or Firm*—Rabin & Champagne, P.C.

[57] ABSTRACT

When a maximum likelihood sequence estimator according to the present invention is used as an equalizer or the like for a receiver, a Viterbi algorithm processing portion 331 in the maximum likelihood sequence estimator estimates a transmission symbol $Ea_n$ with a reception signal $y_n$ and an estimated impulse response $\{Eh_k\}$ corresponding to Viterbi algorithm so as to estimate a maximum likelihood sequence corresponding to a soft decision regardless of a modulating method. A transmission logic code decoder 34 converts a transmission symbol $Ea_n$ into hard decision data $Eb_m$ with a value "1" or "0". An envelope detector 333 that is a transmission line quality evaluating means detects an envelope level $p_n$ of the reception signal $y_n$. A soft decision value converting portion 334 converts the envelope level $p_n$ received from the envelope detector 333 corresponding to the value "1" or "0" of the hard decision data $Ebm$ received from the transmission logic code decoder 34 so as to obtain soft decision value output data $q_m$.

21 Claims, 9 Drawing Sheets

(a) f_i( ): RELIABILITY FUNCTION IN THE CASE OF (0,0) OR (1,1)

(b) f_q( ): RELIABILITY FUNCTION IN THE CASE OF (0,0) OR (1,1)

(c) f_i( ): RELIABILITY FUNCTION IN THE CASE OF (0,1) OR (1,0)

(d) f_q( ): RELIABILITY FUNCTION IN THE CASE OF (0,1) OR (1,0)

MAXIMUM LIKELIHOOD SEQUENCE ESTIMATOR AND MAXIMUM LIKELIHOOD SEQUENCE ESTIMATING METHOD

FIELD OF THE INVENTION

The present invention relates to a maximum likelihood sequence estimator for an equalizer that compensates for the distortion of a transmission path for a digital communication receiver and a maximum likelihood sequence estimating method thereof.

BACKGROUND OF THE INVENTION

In recent years, digital mobile communications have been aggressively used. However, in ground mobile communications, due to the influence of much interference of delayed waves and high speed movement of mobile terminals, frequency selective fading takes place and thereby the received signal waveforms are remarkably distorted. Thus, the distorted signal waveforms should be compensated by equalizers.

The problems caused by the occurrence of the frequency selective fading have been discussed in many technical papers such as "J. G. Proakis, F Digital Communications. New York, McGraw-Hill, 1983, pp 610–627 (hereinafter named reference 1)", "B. Sklar, Digital Communications. Prentice Hall, 1988, pp 314–338 (hereinafter named reference 2)", and "J. Hagenauer et al., A Viterbi Algorithm with Soft-Decision Outputs and its Application. Proceedings of Globcom '89, pp 47.1.1–47.1.7, 1989 (hereinafter named reference 3)".

One of the most effective equalizing methods for obtaining correct transmission data from a reception signal waveform that is distorted due to a delay characteristic of a transmission path, such as frequency selective fading, and high speed fading is known as maximum likelihood sequence estimation.

First of all, with reference to FIG. 2, structures of a transmitter and a receiver used for a digital mobile communication and signal flows thereof, will be described in brief.

In a transmitter 1, an error correction code encoder 11 encodes transmission information data $c_m$ with an error correction code. Next, a transmission logic code encoder 12 converts transmission data $b_m$, which has been encoded with the error correction code, into a transmission symbol $a_n$. A transmission low pass filter 13 limits the band of the transmission symbol $a_n$ and generates a transmission complex base band signal s(t). Last, a modulator 14 modulates the transmission complex base band signal s(t) with a carrier and transmits the modulated signal as a signal $s_c(t)$.

The signal $s_c(t)$ is received as a signal $r_c(t)$ by a receiver 3 over a transmission path 2.

In the receiver 3, a demodulator 31 converts the signal $r_c(t)$ into a complex base band signal r(t). A reception low pass filter 32 limits the band of the complex base band signal r(t) and generates a reception complex base band signal y(t). The reception complex base band signal y(t) is sampled at symbol intervals T and thereby a sample value yn is obtained. An equalizer 33 compensates characteristics of the transmission path influenced by the frequency selective fading and estimates a transmission symbol from the sample value $y_n$ so as to obtain an estimated value $Ea_n$. A transmission logic code decoder 34 converts the estimated value $Ea_n$ of transmission symbol into transmission data $Eb_m$. Since the transmission data $Eb_m$ is a code that has been encoded with the error correction code, an error correction code decoder 35 decodes the transmission data $Eb_m$ so as to obtain information data $Ec_m$.

The error correction code encoding is a systematic encoding method that alleviates an error that takes place on communication path. In the digital mobile communications, convolution codes are often used. As a decoding method for the convolution codes, the Viterbi algorithm is generally used.

The Viterbi algorithm is a decoding method that effectively executes a maximum likelihood decoding using a repeating structure of the convolution code. In the Viterbi algorithm, a bit sequence on a trellis chart and a reception bit sequence are compared. A path is selected so that data is decoded with least error (this path is referred to as the maximum likelihood path). In such a manner, a transmission signal is estimated.

Since the Viterbi algorithm, which is a convolution encoding method and a convolution decoding method, is described in the reference 2, a detailed description is omitted.

The Viterbi algorithm is largely categorized as hard decision and soft decision. The hard decision of the Viterbi algorithm treats an input signal as having one of two values, "1" and "0". On the other hand, the soft decision of the Viterbi algorithm treats an input signal as having one of three values, "1", "0", and a value which is intermediate thereof. Since the soft decision of the Viterbi algorithm is made based on many values, it provides better characteristics than the hard decision.

When a reception signal sequence $y_N = \{y1, y2, \ldots, y_N\}$ is obtained in a particular finite range, the maximum likelihood sequence estimator that is used as the equalizer 33 estimates a transmission symbol sequence $a_N = \{a_1, a_2, \ldots, a_N\}$ having the highest probability (likelihood) of which $y_N$ is accomplished with a known impulse response h(t) of the transmission path.

As the algorithm for the maximum likelihood estimation, the Viterbi algorithm is generally used. However, unlike with the demodulation of a convolution code, in the Viterbi algorithm, the number of states and the number of branches vary depending on each modulating method.

In the case of the convolution code, the number of states is $2^{K-1}$. In each state at a particular time, there are two branches that may take place in a state at a time prior to the particular time by one time unit. On the other hand, in the case of the maximum likelihood sequence estimation, assuming that there are M transmission symbols, the number of states is $M^{K-1}$ and the number of branches is M (where K is referred to as a restriction length). In the case of the convolution code, K is the length of the encoder. In the case of the maximum likelihood sequence estimation, K is the length of an impulse response of a transmission path.

FIG. 1 is a block diagram showing a structure of a maximum likelihood sequence estimator used as a conventional equalizer 33. The maximum likelihood sequence estimator is composed of a Viterbi algorithm processing portion 331 and a transmission path estimator 332.

The transmission path estimator 332 outputs an impulse response of a transmission path 2 to the Viterbi algorithm processing portion 331. Since the impulse response of the transmission path 2 is actually not known, the transmission path estimator 332 estimates the impulse response with a reception signal $y_n$, a known transmission signal that is a synchronous sequence thereof, and an estimated transmission symbol $Ea_n$ or a reception signal $Y_n$ and an estimated transmission symbol $Ea_n$ corresponding to such as an adaptive algorithm.

The Viterbi algorithm processing portion 331 estimates a transmission symbol with the reception signal $y_n$ and the impulse response {$Eh_k$} (where k=0, 1, ..., K) estimated by the transmission path estimator 332 corresponding to the Viterbi algorithm.

The transmission logic code decoder 34 converts the transmission symbol $Ea_n$ estimated by the maximum likelihood sequence estimator, which is the equalizer 33, into an estimated value $Eb_m$ of the transmission data and inputs the estimated value $Eb_m$ to the error correction code decoder 35. The transmission symbol $Ea_n$ estimated by the equalizer 33 is one of M that depends on a modulating method. Thus, the transmission data $Eb_m$ decoded by the transmission logic code decoder 34 is "1" or "0" (namely, a hard decision value). Since the transmission data $Eb_m$ is a hard decision value, the error correction code decoder 35 performs a decoding process corresponding to the hard decision of the Viterbi algorithm.

As described above, since the output data of the equalizer 33 is a hard decision value, processes downstream thereof are performed by the hard decision Viterbi algorithm. However, as described above, in the Viterbi algorithm of the convolution code, since the soft decision provides better characteristics than the hard decision, the output data of the equalizer 33 is preferably a soft decision value.

The reference 3 describes a Viterbi algorithm that outputs both a hard decision value and a soft decision value at the same time.

However, in the conventional soft decision type maximum likelihood sequence estimator proposed in the reference 3, it is assumed that one symbol accords with one bit.

In other words, in the maximum likelihood sequence estimator disclosed by the reference 3, when the Viterbi algorithm selects a particular path, it analyzes the correctness of whether or not the selection is correct as a function of $\Delta = M(2) - M(1)$, where $M(1)$ is a path metric of a path that is selected and $M(2)$ is a path metric of a path that is not selected. As is clear from the analyzing method, the soft decision type maximum likelihood sequence estimator disclosed in the reference 3 can be used only when the number of branches is two. Thus, the soft decision type maximum likelihood sequence estimator cannot be used other than with a modulating method of which one bit is transmitted with one symbol.

In the case of a $\pi/4$ shift difference type phase modulation (DQPSK) or the like, since the hard decision output type maximum likelihood sequence estimator is used, an error correction code decoder downstream thereof should use the hard decision Viterbi algorithm. Thus, the characteristics of the Viterbi algorithm used in the error correction code decoder can be fully accomplished.

SUMMARY OF THE INVENTION

To solve the above described problem, the present invention is a maximum likelihood sequence estimator, comprising a transmission path estimating means for estimating an impulse response of a transmission path with a reception signal, a maximum likelihood sequence estimating means for estimating the maximum likelihood of a transmission symbol sequence of the reception signal with the impulse response of the transmission path estimated by the transmission path estimating means, a transmission path quality evaluating means for evaluating the quality of the transmission path, and a soft decision value converting means for converting an evaluated result received from the transmission path quality evaluating means corresponding to a value "1" or "0" that is decoded data of the maximum likelihood estimated transmission symbol sequence based on a transmission encoding theory and for outputting the resultant value as a soft decision value.

These and other objects, features and advantages of the present invention will become more apparent in light of the following detailed description of best mode embodiments thereof, as illustrated in the accompanying drawings.

BRIEF DESCRIPTION OF DRAWINGS

FIG. 5 is a block diagram showing structures of a transmitter and a receiver used for a digital mobile communication and signal flows thereof in the case that the maximum likelihood sequence estimator according to the first embodiment is used as the equalizer 33a;

DETAILED DESCRIPTION OF THE PREFERRED EMBODIMENTS (A) FIRST EMBODIMENT

Next, with reference to FIGS. 3, 4, and 5, a maximum likelihood sequence estimator according to a first embodiment of the present invention will be described.

Figure 2:
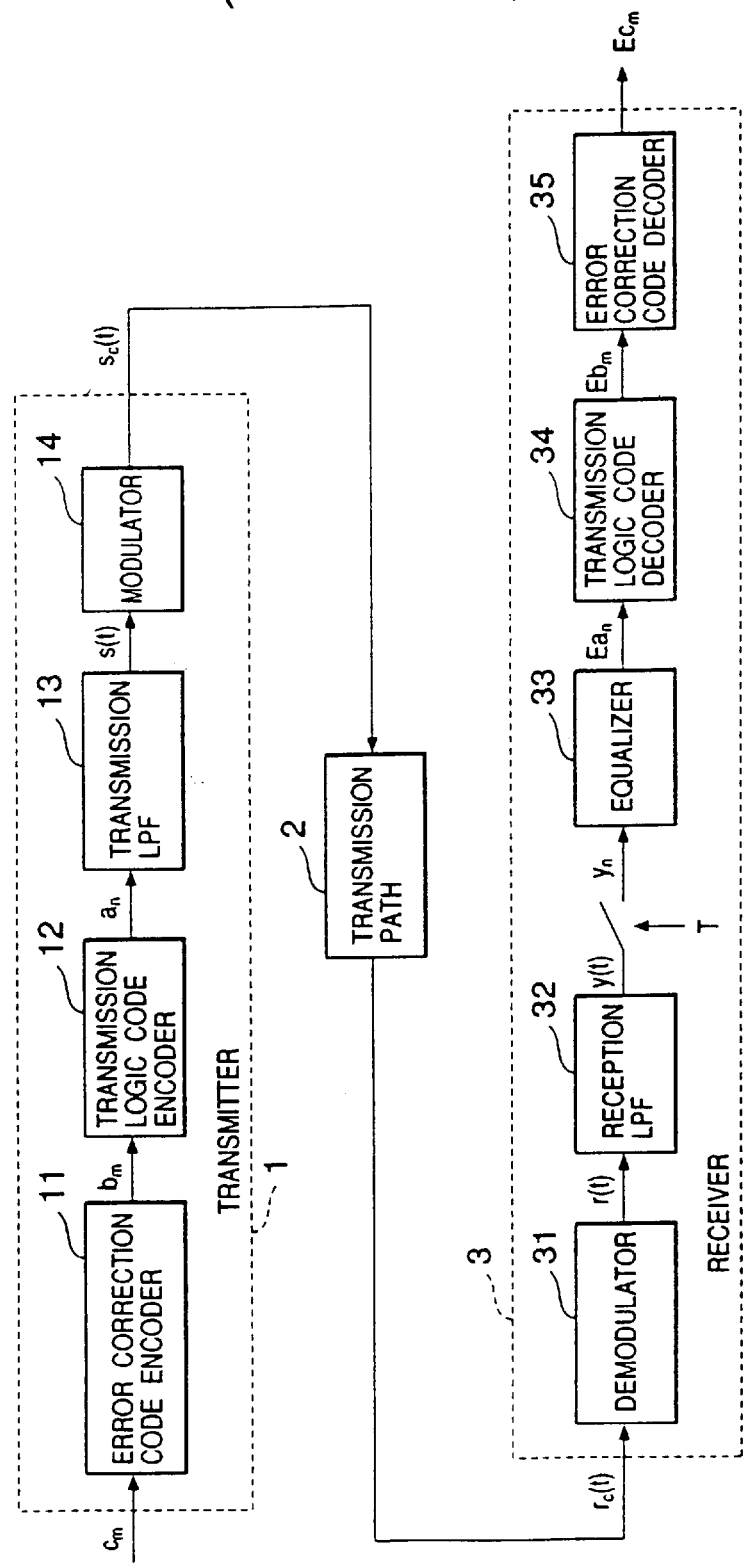
FIG. 2 is a block diagram showing structures of a conventional transmitter and a conventional receiver used for a digital mobile communication and signal flows thereof.

First of all, with reference to FIG. 5, structures of a transmitter and a receiver for a digital mobile communication and signal flows thereof in the case that a maximum likelihood sequence estimator according to the first embodiment is used as an equalizer 33a will be described. In FIG. 5, similar portions as those in FIG. 2 are denoted by similar reference numerals.

As with the related art reference, an error correction code encoder 11 in a transmitter 1 encodes transmission information data $c_m$ with an error correction code. A transmission logic code encoder 12 converts transmission data $b_m$ that has been encoded with the error correction code into a transmission symbol $a_n$. A transmission low pass filter 13 limits the band of the transmission symbol $a_n$ and generates a transmission complex base band signal s(t). A modulator 14 modulates the transmission complex base band signal s(t) and transmits the modulated signal as a signal $s_c(t)$.

The signal $s_c(t)$ is received as a signal $r_c(t)$ by a receiver 3a over a transmission path 2.

A demodulator 31 in the receiver 3a converts the signal $r_c(t)$ into a complex base band signal r(t). A reception low pass filter 32 limits the band of the complex base band signal r(t) and generates a reception complex base band signal y(t). The reception complex base band signal y(t) is sampled at symbol intervals T and thereby a sample value $y_n$ is obtained.

The equalizer 33a compensates for the distortion of a characteristic of the transmission path influenced by a frequency selective fading and estimates a transmission symbol $Ea_n$ from the sample value $y_n$. The transmission symbol $Ea_n$ is sent to a transmission logic code decoder 34. The transmission logic code decoder 34 converts the transmission symbol $Ea_n$ into hard decision data $Eb_m$ with a value "1" or "0" and sends back the hard decision data $Eb_m$ to the equalizer 33a.

The equalizer 33a uses an envelope level of the reception signal $y_n$ as an evaluated value of the quality of the transmission path, converts the envelope level corresponding to the value "1" or "0" of the hard decision data $Eb_m$ received from the transmission logic code encoder 34, and sends the converted signal as soft decision value output data $q_m$ to an error correction code decoder 35a.

The error correction code decoder 35a decodes the input soft decision value output data $q_m$ corresponding to the soft decision Viterbi algorithm and obtains information data $Ec_m$.

As with the conventional equalizer 33, when a reception signal sequence $Y_N = \{y_1, y_2, \ldots, y_N\}$ is obtained in a particular finite range, the maximum likelihood sequence estimator used as the equalizer 33a estimates a transmission symbol sequence $a_N = \{a_1, a_2, \ldots, a_N\}$ that has the largest probability (likelihood) of which $Y_N$ is accomplished with a known impulse response h(t) of the transmission path. The maximum likelihood sequence estimator uses the Viterbi algorithm as a maximum likelihood estimating algorithm. The equalizers 33 and 33a are largely different from each other in that the equalizer 33 outputs only the hard decision data $Eb_m$ and the equalizer 33a finally outputs the soft decision value output data $q_m$.

The maximum likelihood sequence estimator according to the first embodiment can output the soft decision value output data $q_m$ corresponding to the theory that follows.

When the noise of the receiver is constant, the level of the reception signal is proportional to the S/N ratio of the signal. When the level of the reception signal is large, the S/N ratio of the signal is also large. Thus, the accuracy of the impulse response of the transmission path estimated by the maximum likelihood sequence estimating means is high. Consequently, a maximum likelihood sequence estimating means can correctly identify the reception signal and estimate a transmission symbol sequence. However, when the level of the reception signal is low, the S/N ratio thereof is also small. Thus, the accuracy of the impulse response of the transmission path estimated by the transmission path estimating means is low. Consequently, in addition to the deterioration of the error correction performance due to the decrease in the S/N ratio of the signal, the transmission symbol sequence may be incorrectly estimated by the maximum likelihood sequence estimating means. Thus, the estimated transmission data decoded corresponding to the incorrect estimated transmission symbol sequence may be incorrect.

In other words, it seems that the correctness of the estimated transmission data that is output from the transmission logic code decoder has a correlation with the level of the reception signal.

Thus, the level of the reception signal is treated as the envelope level of the reception signal. When the envelope level is large, the determined value is relatively heavily weighted. In contrast, when the envelope level is small, the determined value is relatively lightly weighted. Thus, the soft decision value can be obtained.

Figure 1:
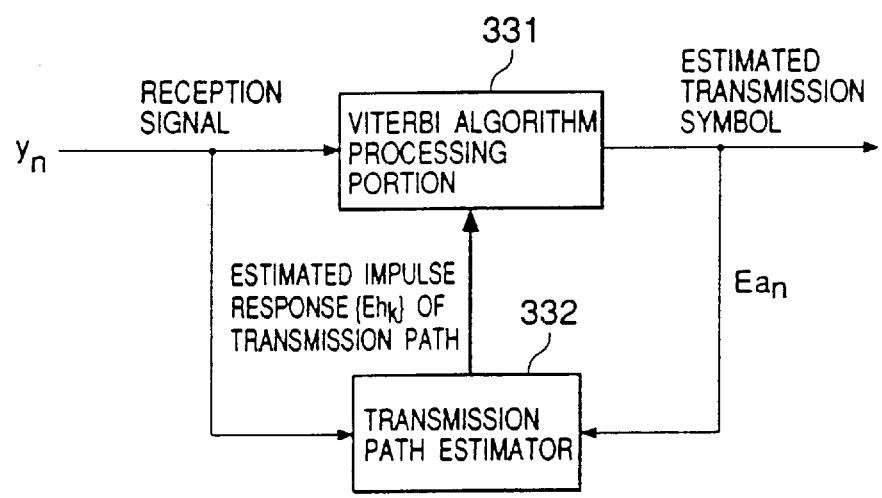
FIG. 1 is a block diagram showing a structure of a conventional maximum likelihood sequence estimator that is used as an equalizer 33.
Figure 3:
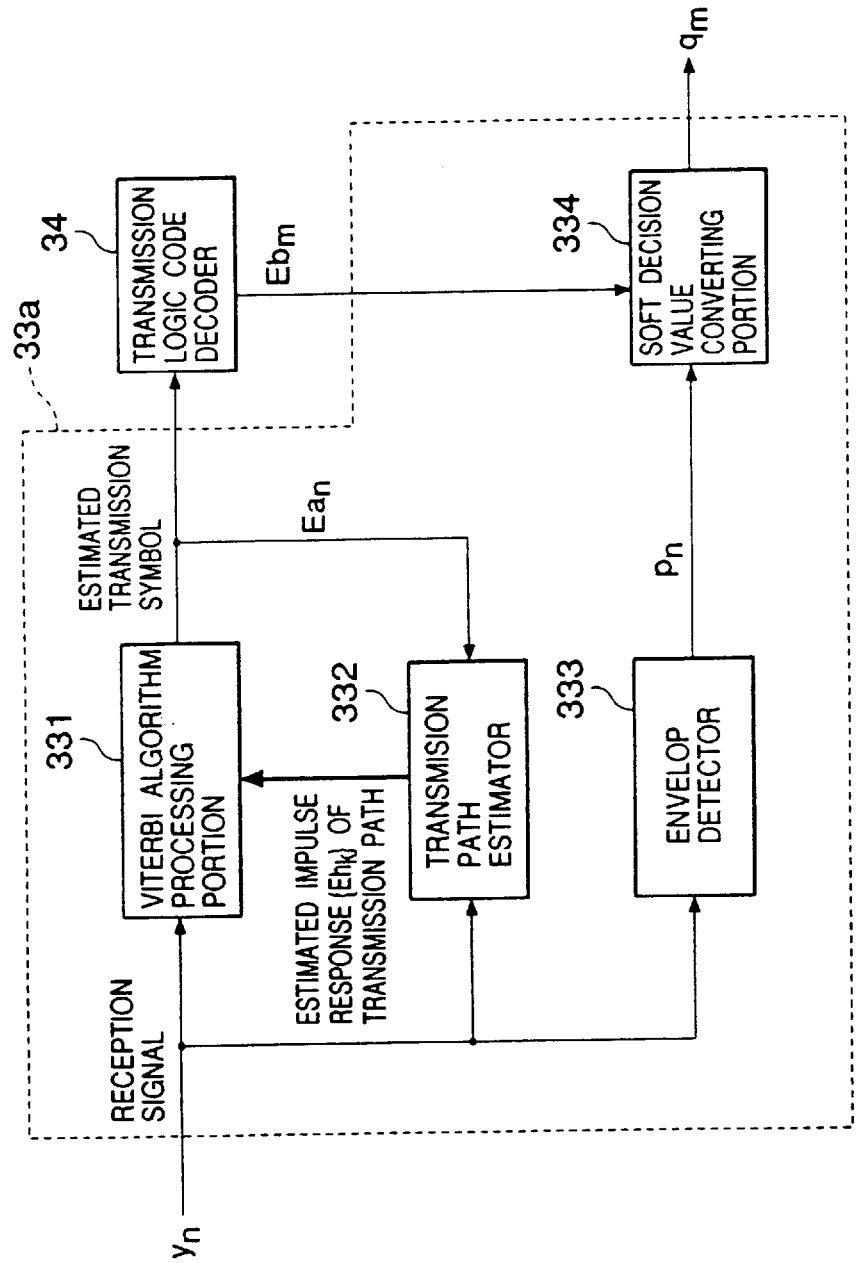
FIG. 3 is a block diagram showing a structure of a maximum likelihood sequence estimator according to a first embodiment of the present invention.

FIG. 3 is a block diagram showing a structure of a maximum likelihood sequence estimator used as the equalizer 33a. In FIG. 3, similar portions to those in FIG. 1 are denoted by similar reference numerals.

The maximum likelihood sequence estimator shown in FIG. 3 is accomplished by discrete circuits composed of a large scale integrated circuit (LSI) or the like or a program executed by a processor. The maximum likelihood sequence estimator is composed as functional blocks of a Viterbi algorithm processing portion 331, a transmission path estimator 332, an envelope detector 333, and a soft decision value converting portion 334. When the maximum likelihood sequence estimator functions as the equalizer 33a, a reception signal $y_n$ that is input from a transmission path 2 is decoded in the following manner.

The reception signal $y_n$ is input to the transmission path estimator 332, the Viterbi algorithm processing portion 331, and the envelope detector 333 that is a transmission path quality evaluating means.

The transmission path estimator 332 estimates an impulse response of the transmission path 2 with the input reception signal $y_n$ and a transmission symbol $Ea_n$ estimated by the Viterbi algorithm processing portion 331 corresponding to LMS (Least Mean Square) adaptive algorithm or the like and sends the result as a new estimated impulse response $\{Eh_k\}$ (where k=1, 0, ..., K) to the Viterbi algorithm processing portion 331.

The Viterbi algorithm processing portion 331 estimates a transmission symbol $Ea_n$ with the reception signal $y_n$ and the estimated impulse response $\{Eh_k\}$ (where k=0, 1, ..., K) corresponding to the Viterbi algorithm and sends the estimated symbol $Ea_n$ to the transmission path estimator 332 and the transmission logic code decoder 34.

The transmission symbol $Ea_n$ is one of M that depends on a modulating method. As described above, the transmission logic code decoder 34 converts the transmission symbol $Ea_n$ into hard decision data $Eb_m$ with a value "1" or "0" and sends the hard decision data $Eb_m$ to the soft decision value converting portion 334.

On the other hand, the envelope detector 33 detects an envelope level $P_n$ of the input reception signal $y_n$ corresponding to a low pass filter calculation using an IIR (Infinite Impulse Response) filter as expressed by the following equation (1).

$$p_n = (1-\delta) \cdot p_{n-1} + \delta \cdot |yn|^2 \tag{1}$$

where $\delta$ ($0<\delta<1$) is a coefficient corresponding to Doppler frequency and symbol intervals.

The envelope level $p_n$ detected by the filter calculation expressed by the equation (1) is sent to the soft decision value converting portion 334.

The soft decision value converting portion 334 converts the envelope level $p_n$ corresponding to the value "1" or "0" of the input hard decision data $Eb_m$ and obtains hard decision value output data $q_m$.

Figure 4:
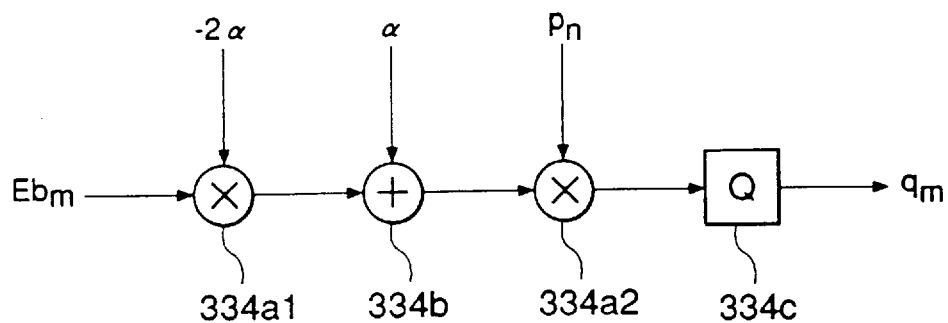
FIG. 4 is a block diagram showing a detailed structure of a soft decision value converting portion 334 according to the first embodiment of the present invention.
Figure 5:
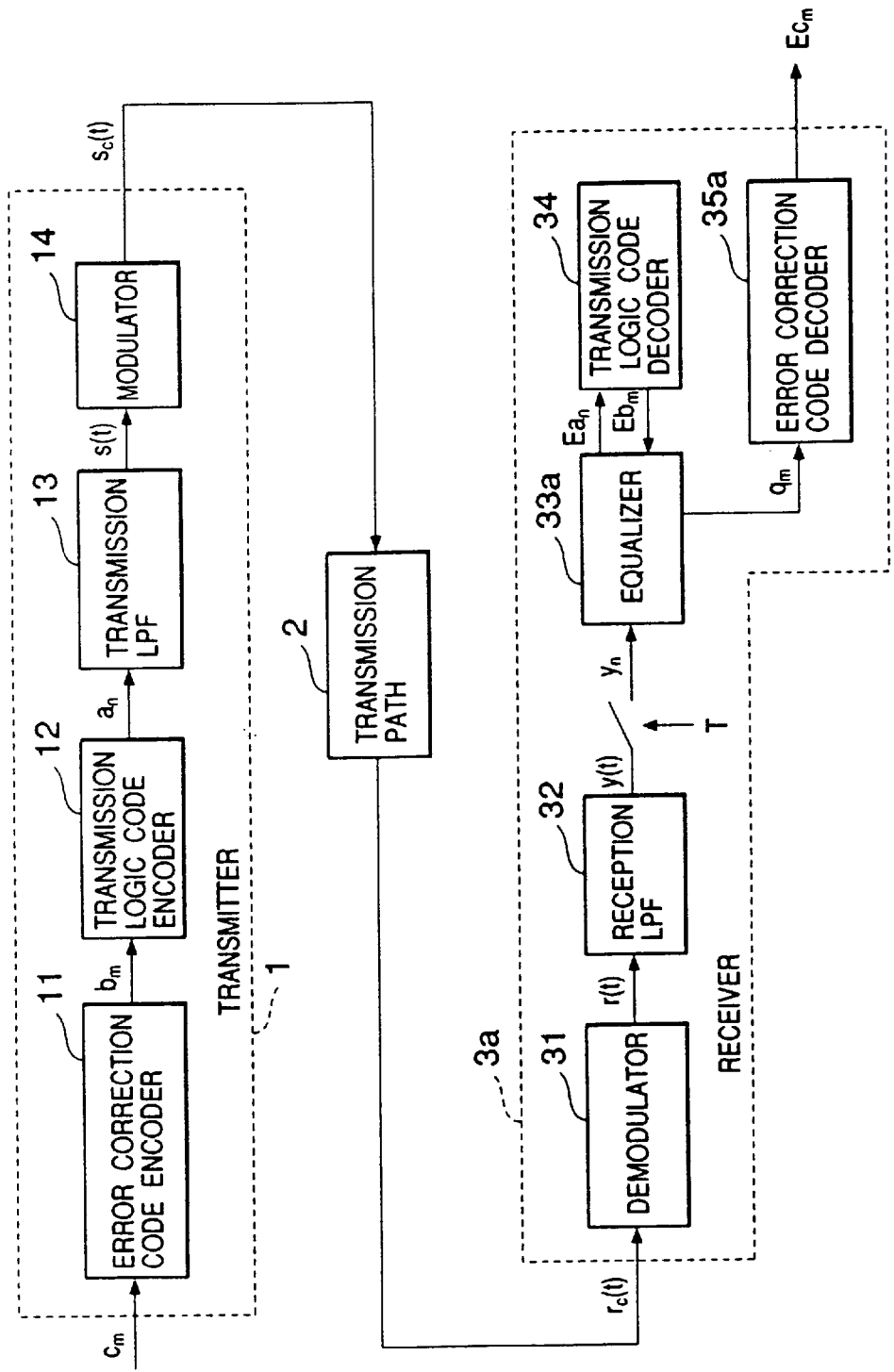

FIG. 4 is a block diagram showing a detailed structure of the soft decision value converting portion 334. The soft decision value converting portion 334 shown in FIG. 4 is composed of a multiplying device 334a1, an adding device 334b, a multiplying device 334a2, and a quantizing device 334c that are connected in series. The multiplying device 334a1 multiplies the hard decision data $Eb_m$ that is input to the soft decision value converting portion 334 by "$-2\alpha$". The adding device 334b adds the output data of the multiplying device 334a1 and "$\alpha$". The multiplying device 334a2 multiplies the output data of the adding device 334b by the envelope level $p_n$. The quantizing device quantizes the output data of the multiplying device 334a2.

Since the value of the hard decision data Ebm is either "0" or "1", with the structure shown in FIG. 4, the envelope level $p_n$ detected by the envelope detector 333 is converted corresponding to the value "0" or "1" of the hard decision data $Eb_m$ that is output from the transmission logic code decoder 34.

If $Eb_m=0$, $q_m=Q\ [+\alpha \cdot p_n]$

If $Eb_m=1$, $q_m=Q\ [-\alpha \cdot p_n]$

The converted value of the envelope level $p_n$ is sent as soft decision value output data $q_m$ to the error correction code decoder 35a. The error correction code decoder 35a decodes the soft decision value output data $q_m$ corresponding to the soft decision Viterbi algorithm. In the above-described expressions, $\alpha$ is a conversion coefficient that depends on the dynamic range of the apparatus and $Q[\cdot]$ is a quantizer.

Thus, even if values of the hard decision data $Eb_m$ that are output from the transmission logic code decoder 34 are the same, depending on the envelope level $p_n$, values of the soft decision value output data $q_m$ that are output from the soft decision value converting portion 334 vary.

In a modulating system of which M bits are transmitted with one symbol, a soft decision value is converted with the same envelope level for each symbol. Thus, although the absolute values of M soft decision values decoded from a reception signal for one symbol are the same, the signs thereof vary depending on hard decision values.

This is because the level of the reception signal $y_n$ affects both the estimation of an impulse response $\{Eh_k\}$ of a transmission path estimated by the transmission path estimator 332 and the accuracy of the transmission symbol $Ea_n$ estimated by the Viterbi algorithm processing portion 331. When the noise of the receiver is constant, the level of the reception signal is proportional to the S/N ratio of the signal. When the level of the reception signal $y_n$ is large, the S/N ratio of the signal is also large. Thus, the accuracy of the impulse response $\{Eh_k\}$ of the transmission path estimated by the transmission path estimator 332 is high. Consequently, the Viterbi algorithm processing portion 331 can correctly identify the reception signal $y_n$ and estimate the transmission symbol $Ea_n$. However, when the level of the reception signal $y_n$ is low, the S/N ratio thereof is also small. Thus, the accuracy of the impulse response $\{Eh_k\}$ of the transmission path estimated by the transmission path estimator 332 is low. Consequently, in addition of the deterioration of the error correction performance due to the decrease of the S/N ratio of the signal, the transmission symbol $Ea_n$ may be incorrectly estimated by the algorithm processing portion 331. Thus, the transmission data $Eb_m$ that has a value "0" or "1" and that is decoded by the transmission logic code decoder 34 corresponding to the incorrect transmission symbol $Ea_n$ may be incorrect.

In other words, it seems that the correctness of the transmission data $Eb_m$ that is output from the transmission logic code decoder 34 depends on the level of the reception signal $y_n$.

Thus, the level of the reception signal $y_n$ is treated as the envelope level $p_n$ of the reception signal $y_n$. When the envelope level $p_n$ is large, the determined value is relatively heavily weighted. In contrast, when the envelope level $p_n$ is small, the determined value is relatively lightly weighted. Thus, the soft decision value can be obtained.

(B) SECOND EMBODIMENT

Figure 7:
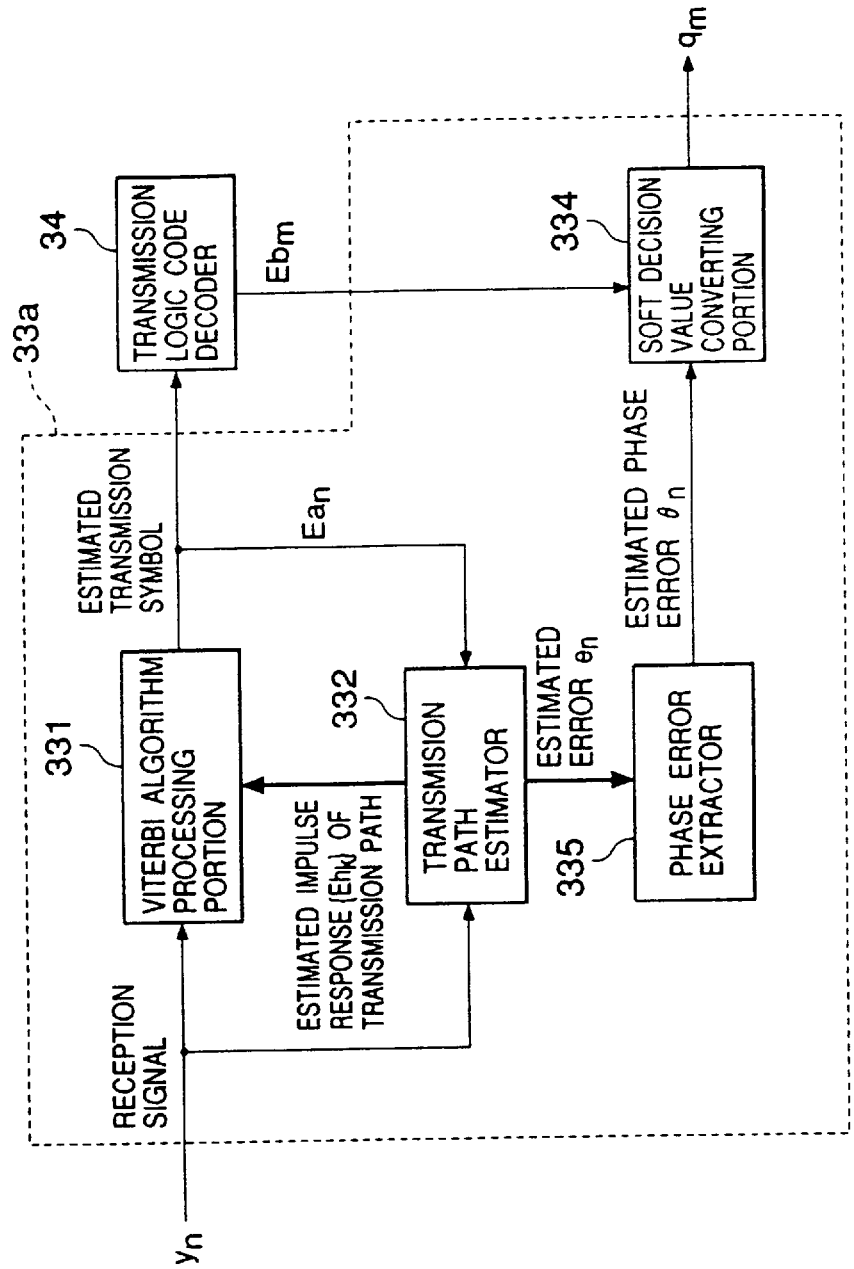
FIG. 7 is a block diagram showing a structure of a maximum likelihood sequence estimator according to a second embodiment of the present invention.

FIG. 7 is a block diagram according to a second embodiment of the present invention. The maximum likelihood sequence estimator shown in FIG. 7 is composed of the structure shown in FIG. 1, a soft decision value converting portion 334, and a phase error extractor 335 that is a transmission path quality evaluating means. The structure of the transmission logic code decoder 34 is the same as the structure of the transmission logic code decoder 34 shown in FIG. 1. According to the second embodiment, soft decision value output data $q_m$ instead of the hard decision value $Eb_m$ is input to the error correction code decoder 35 shown in FIG. 2.

The maximum likelihood sequence estimator according to the second embodiment can output soft decision value output data $q_m$ corresponding to the following theory.

When the estimated error is large, the accuracy of the impulse response of the transmission path estimated by the transmission path estimating means deteriorates. Thus, the error correction performance of the transmission symbol sequence estimated by the maximum likelihood sequence estimating means is deteriorates. Consequently, the estimated transmission data decoded corresponding to the incorrect estimated transmission symbol sequence may be incorrect.

In other words, it seems that the correctness of the estimated transmission data that is output from the transmission logic code decoder has a correlation with the estimated error. Thus, when the estimated error is large, the determined value is relatively lightly weighted. In contrast, when the estimated error is small, the determined value is relatively heavily weighted. Consequently, the soft decision value can be obtained.

Next, the operation of the second embodiment will be described.

First, a transmission symbol equivalent to a conventional hard decision value is estimated.

When a reception signal $y_n$ is input to a Viterbi algorithm processing portion 331, it estimates a transmission symbol with an estimated value $\{Eh_k\}$ (where k=0, ..., K) of an impulse response of a transmission path estimated by a transmission path estimator 332 corresponding to Viterbi algorithm.

A transmission path estimator 332 estimates an impulse response of the transmission path with the reception signal $y_n$ and the transmission symbol $Ea_n$ estimated by the Viterbi algorithm processing portion corresponding to an adaptive algorithm such as an LMS algorithm and outputs the estimated value of the impulse response to the Viterbi algorithm processing portion 331. A transmission logic code decoder 34 converts the estimated value $Ea_n$ of the transmission symbol into hard decision data $Eb_m$ with a value "1" or "0".

On the other hand, a phase error extractor 335 detects a phase component of an estimated error $e_n$ of the transmission path, namely an estimated phase error $\theta_n$. The estimated phase error $\theta_n$ may be obtained with for example $\tan^{-1}$.

A soft decision value converting portion 334 outputs a converted value of the estimated phase error $\theta_n$ corresponding to the value "1" or "0" of the hard decision data Ebm that is output from the transmission logic code decoder 34 to an error correction code decoder 35.

Next, as an example of a modulating method of which M bits are transmitted with one symbol, a QPSM method will be described.

Figure 8:
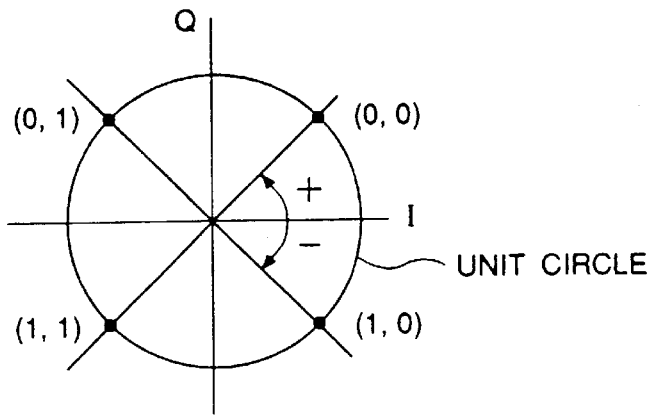
FIG. 8 is a block diagram for defining the relation of a phase rotating direction on a phase plane and codes.
Figure 9:
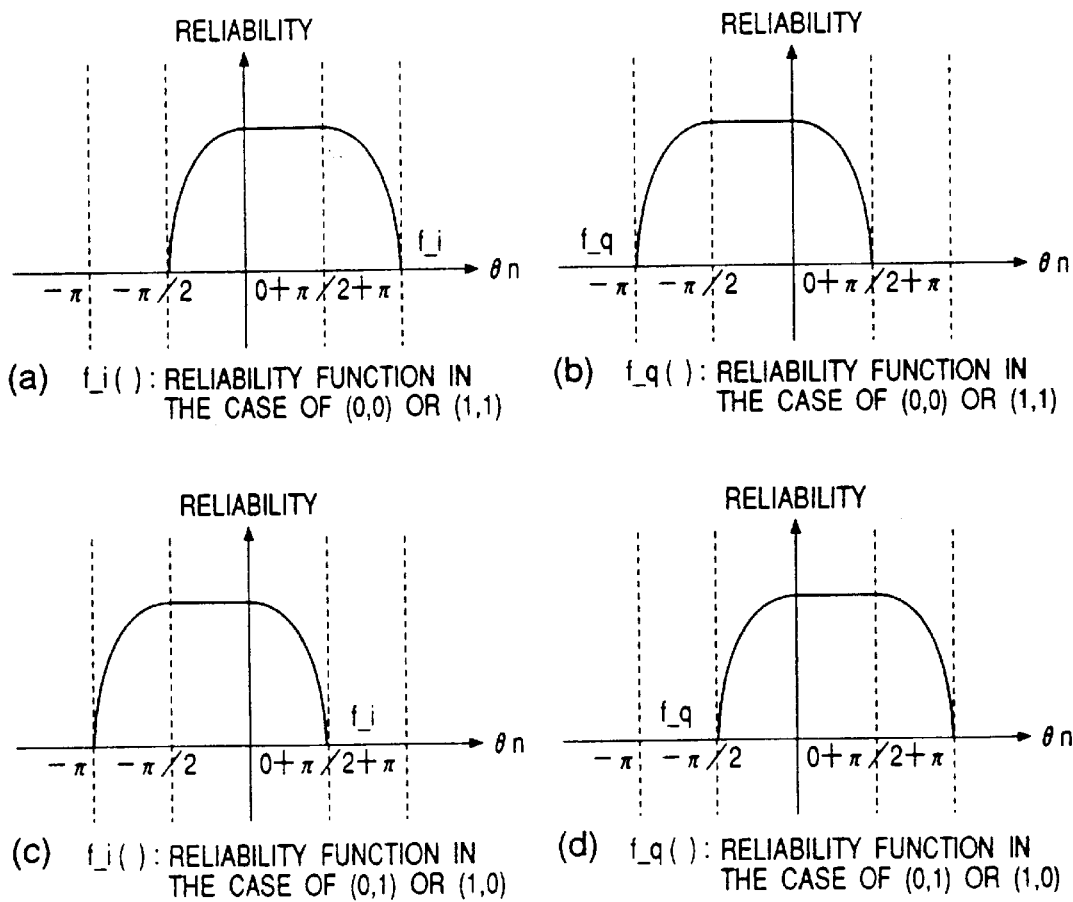
FIGS. 9(a), 9(b), 9(c), and 9(d) are schematic diagrams for defining a converting function of estimated errors and reliability thereof.

In the QPSK method, two bits are transmitted with one symbol. Assuming that the two bits are denoted by ($b_{m\_i}$, $b_{m\_q}$), the relation between symbols on the phase plane and sets of two bits can be defined as shown in FIG. 8.

In the relation between the phase rotating direction on the phase plane and codes, the counterclockwise rotation is defined as the forward direction and the clockwise direction is defined as the backward direction. In this case, the soft decision value $q_{m\_i}$ of $Eb_{m\_i}$ and the soft decision value $q_{m\_q}$ of $Eb_{m\_q}$ are given as follows.

If $Eb_{m\_i}=0$, $q_{m\_i}=Q[+f\_i(\theta_n, Eb_{m\_i}, Eb_{m\_q})]$

If $Eb_{m\_i}=1$, $q_{m\_i}=Q[-f\_i(\theta_n, Eb_{m\_i}, Eb_{m\_q})]$

If $Eb_{m\_i}=0$, $q_{m\_i}=Q[+f\_i(\theta_n, Eb_{m\_i}, Eb_{m\_q})]$

If $Eb_{m\_i}=1$, $q_{m\_i}=Q[-f\_i(\theta_n, Eb_{m\_i}, Eb_{m\_q})]$ where $Q[\cdot]$ is a quantizer and $f(\theta_n, Eb_{m\_i}, Eb_{m\_q})$ is a converting function of an estimated phase error and a reliability thereof. The converting function is defined as follows (see FIGS. 9(a) to 9(d)).

In the case of ($Eb_{m\_i}=0$ and $Eb_{m\_q}=0$) or ($Eb_{m\_i}=1$ and $Eb_{m\_q}=1$)

$$f\_i(\theta_n, Ebm\_i, Ebm\_q) = \begin{cases} 0 & (\theta_n < -\pi/2) \\ \cos(\theta_n) & (-\pi/2 \leq \theta_n < 0) \\ 1 & (0 \leq \theta_n < \pi/2) \\ \cos(\theta_n - \pi/2) & (\pi/2 \leq \theta_n < \pi) \\ 0 & (\pi \leq \theta_n) \end{cases}$$

$$f\_q(\theta_n, Eb_{m\_i}, Eb_{m\_q}) = \begin{cases} 0 & (\theta_n < -\pi) \\ \cos(\theta_n + \pi/2) & (-\pi \leq \theta_n < -\pi/2) \\ 1 & (-\pi/2 \leq \theta_n < 0) \\ \cos(\theta_n) & (0 \leq \theta_n < \pi/2) \\ 0 & (\pi/2 \leq \theta_n) \end{cases}$$

In the case of ($Eb_{m\_i}=0$ and $Eb_{m\_q}=0$) or ($Eb_{m\_i}=1$ and $Eb_{m\_q}=1$)

$$f\_i(\theta_n, Eb_{m\_i}, Eb_{m\_q}) = \begin{cases} 0 & (\theta_n < -\pi) \\ \cos(\theta_n + \pi/2) & (-\pi \leq \theta_n < -\pi/2) \\ 1 & (-\pi/2 \leq \theta_n < 0) \\ \cos(\theta_n) & (0 \leq \theta_n < \pi/2) \\ 0 & (\pi/2 \leq \theta_n) \end{cases}$$

$$f\_q(\theta_n, Eb_{m\_i}, Eb_{m\_q}) = \begin{cases} 0 & (\theta_n < -\pi/2) \\ \cos(\theta_n) & (-\pi/2 \leq \theta_n < 0) \\ 1 & (0 \leq \theta_n < \pi/2) \\ \cos(\theta_n - \pi/2) & (\pi/2 \leq \theta_n < \pi) \\ 0 & (\pi \leq \theta_n) \end{cases}$$

In addition, the present invention can be applied to a phase modulation of which one symbol accords with one bit.

In this case, the conversions to the soft decision value data are performed as follows.

If $Eb_m=0$, $q_m=Q[+f(\theta_n)]$

If $Eb_m=1$, $q_m=Q[-f(\theta_n)]$ where $Q[\cdot]$ is a quantizer and $f(\theta_n)$ is a converting function of an estimated phase error $\theta_n$ and a reliability thereof. The converting function is for example:

$f(\theta n)=\cos(\theta_n)$ where $|\theta_n| \leq \pi/2$

As described above, according to the second embodiment of the present invention, the maximum likelihood sequence estimator has a phase error extractor that extracts a phase error corresponding to an estimated error of a transmission path estimator. A phase error extractor from the phase error extracted is converted corresponding to a hard decision value and output as a soft decision value. Thus, soft decision output data can be obtained.

Consequently, in a modulating method of which many bits are transmitted with one symbol, the soft decision Viterbi algorithm can be used in an error correction code decoder disposed downstream of the maximum likelihood sequence estimator. As a result, the error rate of data that has been decoded with the error correction code can be reduced.

(C) THIRD EMBODIMENT

Figure 10:
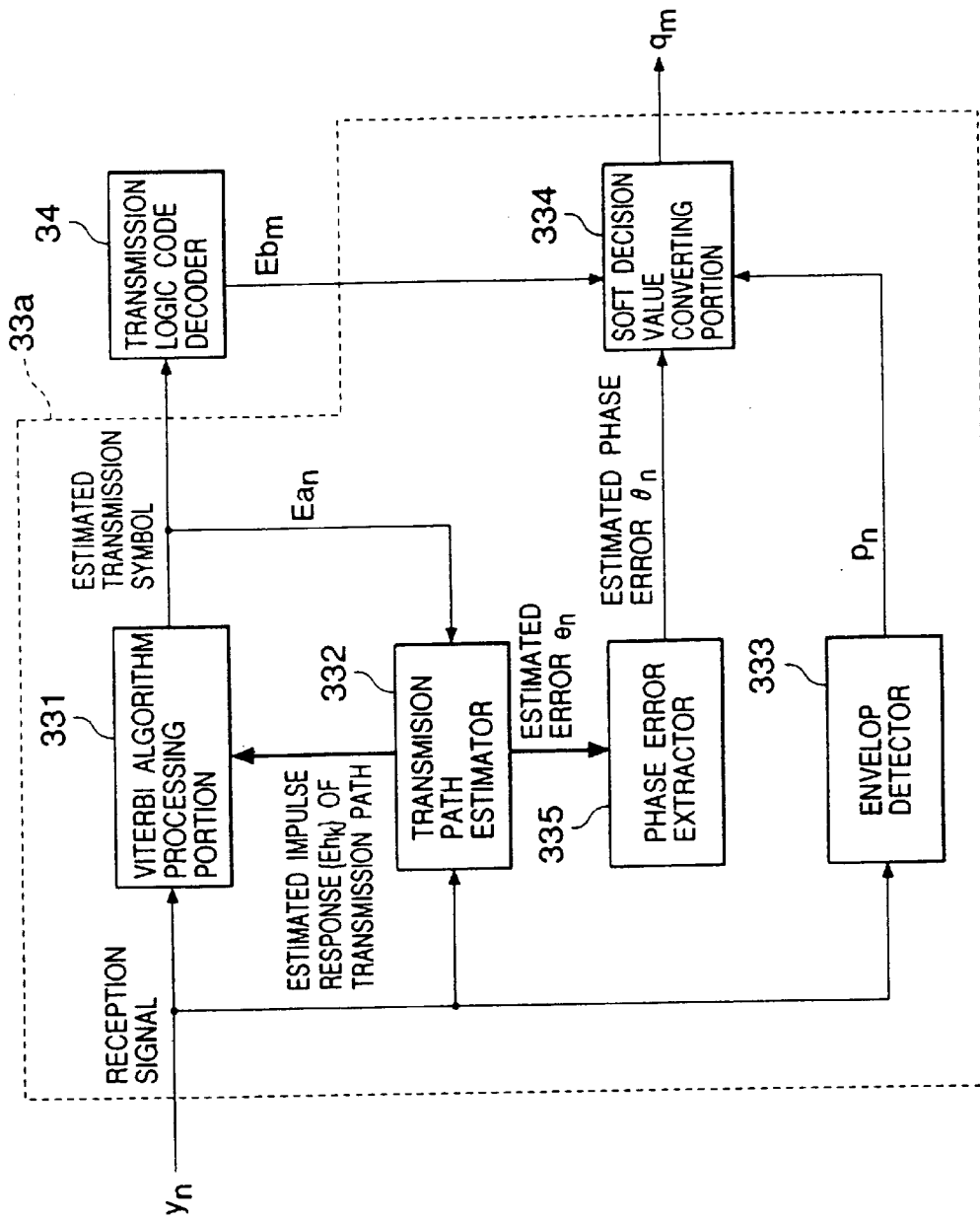
FIG. 10 is a block diagram showing a structure of a maximum likelihood sequence estimator according to a third embodiment of the present invention.

FIG. 10 is a block diagram showing a maximum likelihood sequence estimator according to a third embodiment of the present invention. The maximum likelihood sequence estimator shown in FIG. 10 is composed of the conventional maximum likelihood sequence estimator shown in FIG. 1, a phase error extractor 335, an envelope detector 333, and a soft decision value converting portion 334. The structure of a transmission logic code decoder 34 shown in FIG. 10 is the same as the structure of the transmission logic code decoder 34 shown in FIG. 1. In the third embodiment, soft decision value output data $q_m$ instead of the hard decision value $Eb_m$ is input to the error correction code decoder shown in FIG. 2.

The structure of the third embodiment is composed of the structure of the second embodiment and the envelope detector 333 of the first embodiment. An estimated phase error and an envelope level are given to the soft decision value converting portion 334 so as to convert them into a soft decision value.

Next, the operations of the envelope detector 333 and the soft decision value converting portion 334 will be described.

The envelope detector 333 detects an envelope level $P_n$ of a reception signal $y_n$ corresponding to a low pass filter calculation that is expressed by, for example, the following equation.

$p_n=(1-\delta)\cdot p_{n-1}+\delta\cdot|y_n|^2$ (where $0<\delta<1$)

The filter calculation is performed by an IIR filter. However, the filter calculation may be performed by an FIR filter, moving average method, or a combination thereof.

The soft decision value converting portion 334 outputs soft decision value data, of which the estimated phase error $\theta_n$ and the envelope level $p_n$ have been converted corresponding to the value "1" or "0" of the hard decision data $Eb_m$ that is received from the transmission logic code decoder 34, to the error correction code decoder 35.

Next, as an example of a modulating method of which M bits are transmitted with one symbol, a QPSM method will be described.

In the QPSK method, two bits are transmitted with one symbol. Assuming that the two bits are denoted by ($b_{m\_i}$, $b_{m\_q}$), the relation between symbols on the phase plane and sets of two bits can be defined as shown in FIG. 8.

In the relation between the phase rotating direction on the phase plane and codes, the counterclockwise rotation is defined as the forward direction and the clockwise direction is defined as the backward direction. In this case, the soft decision value $q_{m\_i}$ of $Eb_{m\_i}$ and the soft decision value $q_{m\_q}$ of $Eb_{m\_q}$ are given as follows.

If $Eb_{m\_i}=0$, $q_{m\_i}=Q[+\alpha\cdot p_n\cdot f\_i(\theta_n, Eb_{m\_i}, Eb_{m\_q})]$ If $Eb_{m\_i}=1$, $q_{m\_i}=Q[-\alpha\cdot p_n\cdot f\_i(\theta_n, Eb_{m\_i}, Eb_{m\_q})]$ If $Eb_m\_i=0$, $q_m\_i=Q[+\alpha \cdot p_n \cdot f\_i(\theta_n, Eb_m\_i, Eb_m\_q)]$ If $Eb_m\_i=1$, $q_m\_i=Q[-\alpha \cdot p_n \cdot f\_i(\theta_n, Eb_m\_i, Eb_m\_q)]$ where α is a conversion coefficient and Q[·] is a quantizer f_i($\theta_n$, Eb$_m$_i, Eb$_m$_q) and f_q($\theta_n$, Eb$_m$_i, Eb$_m$_q) of the third embodiment are the same as those of the second embodiment.

The structure of the third embodiment is composed of the structure of the second embodiment and the envelope detector that detects the envelope level of the reception signal. A soft decision value of which the detected envelope level and the phase error have been converted corresponding to the hard decision value is output. Thus, soft decision output data can be obtained more accurately than that of the second embodiment. In addition, the error ratio of data that has been decoded with the error correction code can be reduced.

(D) OTHER EMBODIMENTS

Since the maximum likelihood sequence estimators according to the above-described embodiments are not affected by the Viterbi algorithm processing portion and the transmission path estimator, they can be applied to structures other than those of the above-described embodiments.

For example, besides the structure shown in FIG. 1, a matching filter may be disposed on the input side of the Viterbi algorithm processing portion. A transmission path may be estimated for each state of the Viterbi algorithm processing portion without an estimated transmission symbol that is input to the transmission path estimator. Alternatively, a reception input signal may be sampled at shorter intervals (for example, T/2) than symbol intervals T.

In the above-described embodiments, the filter calculation with the IIR filter of which impulse response infinitely takes place as expressed by the equation (1) was used so as to simplify the circuit structure. Instead, the filtering process with an FIR (Finite Impulse Response) filter of which impulse response finitely takes place, the moving average method, or a combination thereof may be used.

The soft decision value converting portion 334 according to the first embodiment performs a conversion to a soft decision value $q_m$ corresponding to the value "1" or "0" of the input hard decision data Eb$_m$ and the envelope level P$_n$ in such a manner that if Eb$_m$=0, $q_m$=Q[+α·P$_n$] is output and if Eb$_m$=1, $q_m$=Q[-α·P$_n$] is output. This is because the error correction code decoder 35 disposed downstream of the maximum likelihood sequence estimator treats a positive soft decision value as "0" and a negative soft decision value as "1". In the process of a circuit disposed downstream of the maximum likelihood sequence estimator, a converted result corresponding to the envelope level based on the value of the hard decision data Ebm varies.

For example, when the branch metric calculating portion of the Viterbi algorithm decoder of the error correction code decoder 35a disposed downstream of the maximum likelihood sequence estimator treats codes of the convolution coefficients in the reverse manner as the first embodiment, the sign of the conversion coefficient α is inversed (namely, the sign "+" is inversed to "−" or vice versa).

In the second and third embodiments, when an estimated error is evaluated, a phase error corresponding to a phase component was used. However, instead of the phase error, the absolute value of an error may be used. A phase error and the absolute value of an error may be individually evaluated, converted corresponding to a hard decision value, and output as soft decision values as in an envelope level and a phase error according to the third embodiment.

Likewise, values of which a phase error, the absolute value of an error, and an envelope level have been converted corresponding to a hard decision value can be output as soft decision values.

Figure 6:
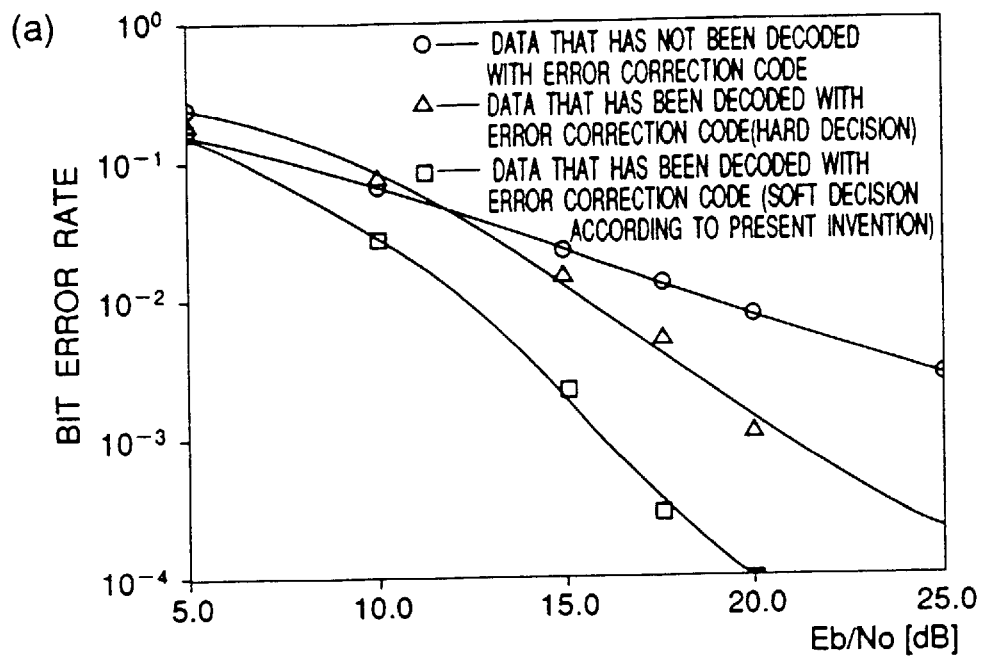
FIGS. 6(a) and 6(b) are schematic diagrams showing simulation results of bit error rates in the case that the first embodiment is applied to $\pi/4$ shift difference type phase modulation (DQPSK)
Figure 6:
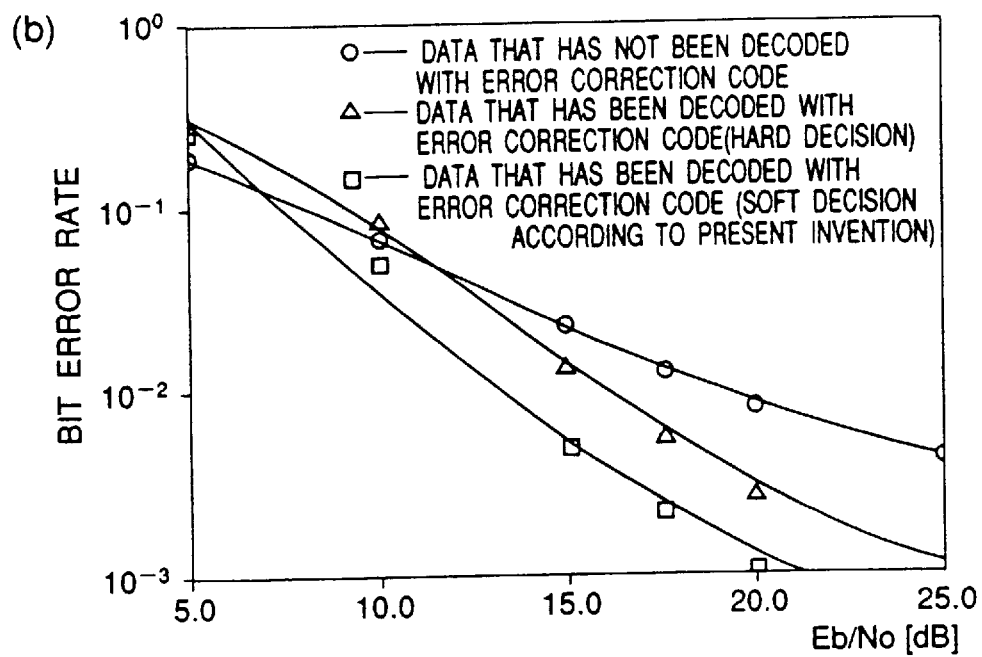

FIGS. 6(a) and 6(b) show simulation results of bit error rates in the case that the first embodiment is applied to a π/4 shift difference type phase modulating (DQPSK) method as an example of the effects of the present invention. The simulations were performed in the following conditions that the symbol intervals T were 41 μsec, that two waves at the same level were used as a transmission path model, that the maximum Doppler frequency was 40 Hz, and that $\delta=2^{-4}$ and α=1, respectively. In FIG. 6(a), the delay intervals of the two waves were 0 T. In FIG. 6(b), the delay intervals of the two waves were 0.5 T.

In FIGS. 6(a) and 6(b), the horizontal axis represents $E_b/N_0$ (ratio of signal power to noise power density per bit). In FIGS. 6(a) and 6(b), "○" represents a bit error rate of data that has not been decoded with an error correction code; "Δ" represents a bit error rate of data that has been decoded with an error correction code corresponding to a hard decision value; and "□" represents a bit error rate of data that has been decoded with an error correction code corresponding to a soft decision value according to the present invention.

In the maximum likelihood sequence estimator according to the present invention, as shown in FIG. 6(a), when the delay intervals are 0 T, the bit error rate is in the range from 1/5 to 1/10. On the other hand, as shown in FIG. 6(b), when the delay intervals are 0.5 T, the bit error rate is improved to 1/2.5. Thus, it is clear that the effect of the present invention is very remarkable.

As described above, the maximum likelihood sequence estimator according to the present invention has a transmission path quality evaluating means. An evaluated value of the transmission path quality evaluating means is converted corresponding to a hard decision value and the resultant value is output as a soft decision value. Thus, regardless of a modulating method, soft decision output data can be obtained. Consequently, when the maximum likelihood sequence estimator is used as an equalizer of the receiver, even in a modulating method of which one symbol is transmitted with many bits, a soft decision Viterbi algorithm can be used in an error correction code decoder. As a result, an error rate of data that has been decoded with an error correction code can be reduced.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A maximum likelihood sequence estimator, comprising:

transmission path estimating means for estimating an impulse response of a transmission path with a reception signal;

maximum likelihood sequence estimating means for estimating the maximum likelihood of a transmission symbol sequence of the reception signal with the impulse response of the transmission path estimated by said transmission path estimating means;

transmission path quality evaluating means for evaluating the quality of the transmission path; and soft decision value converting means for converting an evaluated result received from said transmission path quality evaluating means corresponding to a value "1" or "0" that is decoded data of the maximum likelihood estimated transmission symbol sequence based on a transmission encoding theory and for outputting the resultant value as a soft decision value;

wherein said transmission path quality evaluating means is envelope detecting means for detecting an envelope level of the reception signal and for using the envelope level as the evaluated result; and wherein said soft decision value converting means is adapted for changing the sign of a coefficient corresponding to the value "1" or "0" of the decoded data, for multiplying the envelope level by the resultant coefficient, and for outputting the resultant value as a soft decision value.

2. A maximum likelihood sequence estimator, comprising:

transmission path estimating means for estimating an impulse response of a transmission path with a reception signal;

maximum likelihood sequence estimating means for estimating the maximum likelihood of a transmission symbol sequence of the reception signal with the impulse response of the transmission path estimated by said transmission path estimating means;

transmission path quality evaluating means for evaluating the quality of the transmission path; and soft decision value converting means for converting an evaluated result received from said transmission path quality evaluating means corresponding to a value "1" or "0" that is decoded data of the maximum likelihood estimated transmission symbol sequence based on a transmission encoding theory and for outputting the resultant value as a soft decision value;

wherein said transmission path quality evaluating means is a phase error extracting means for extracting an estimated phase error from an error of the estimated impulse response of the transmission path and for using the estimated phase error as the evaluated result.

3. The maximum likelihood sequence estimator as set forth in claim 2, wherein the estimated phase error is extracted from an absolute value of the error of the estimated impulse response.

4. A maximum likelihood sequence estimator, comprising:

transmission path estimating means for estimating an impulse response of a transmission path with a reception signal;

maximum likelihood sequence estimating means for estimating the maximum likelihood of a transmission symbol sequence of the reception signal with the impulse response of the transmission path estimated by said transmission path estimating means;

transmission path quality evaluating means for evaluating the quality of the transmission path; and soft decision value converting means for converting an evaluated result received from said transmission path quality evaluating means corresponding to a value "1" or "0" that is decoded data of the maximum likelihood estimated transmission symbol sequence based on a transmission encoding theory and for outputting the resultant value as a soft decision value;

wherein said transmission path quality evaluating means is adapted for extracting an error of the estimated impulse response of the transmission path and using the error as the evaluated result.

5. The maximum likelihood sequence estimator as set forth in claim 4, wherein the error extracted by the transmission path quality evaluating means is an absolute value of the error of the estimated impulse response.

6. A maximum likelihood sequence estimator, comprising:

transmission path estimating means for estimating an impulse response of a transmission path with a reception signal;

maximum likelihood sequence estimating means for estimating the maximum likelihood of a transmission symbol sequence of the reception signal with the impulse response of the transmission path estimated by said transmission path estimating means;

transmission path quality evaluating means for evaluating the quality of the transmission path; and soft decision value converting means for converting an evaluated result received from said transmission path quality evaluating means corresponding to a value "1" or "0" that is decoded data of the maximum likelihood estimated transmission symbol sequence based on a transmission encoding theory and for outputting the resultant value as a soft decision value;

wherein said transmission path quality evaluating means is composed of envelope detecting means for detecting an envelope level of the reception signal and phase error extracting means for extracting an estimated phase error from an error of the estimated impulse response of the transmission line and is adapted for using the envelope level and the estimated phase error as the evaluated result.

7. A maximum likelihood sequence estimator, comprising:

transmission path estimating means for estimating an impulse response of a transmission path with a reception signal;

maximum likelihood sequence estimating means for estimating the maximum likelihood of a transmission symbol sequence of the reception signal with the impulse response of the transmission path estimated by said transmission path estimating means;

transmission path quality evaluating means for evaluating the quality of the transmission path; and soft decision value converting means for converting weighting of decoded data of the maximum likelihood estimated transmission symbol sequence based on a transmission encoding theory corresponding to an evaluated result received from said transmission path quality evaluating means and for outputting the resultant value as a soft decision value;

wherein said transmission path quality evaluating means is phase error extracting means for extracting an estimated phase error from an error of the estimated impulse response of the transmission path and for using the estimated phase error as the evaluated result.

8. The maximum likelihood sequence estimator as set forth in claim 7, wherein the estimated phase error is extracted from an absolute value of the error of the estimated impulse response.

9. A maximum likelihood sequence estimator, comprising:

transmission path estimating means for estimating an impulse response of a transmission path with a reception signal;

maximum likelihood sequence estimating means for estimating the maximum likelihood of a transmission symbol sequence of the reception signal with the impulse response of the transmission path estimated by said transmission path estimating means;

transmission path quality evaluating means for evaluating the quality of the transmission path; and soft decision value converting means for converting weighting of decoded data of the maximum likelihood estimated transmission symbol sequence based on a transmission encoding theory corresponding to an evaluated result received from said transmission path quality evaluating means and for outputting the resultant value as a soft decision value;

wherein said transmission path quality evaluating means is adapted for extracting an error of the estimated impulse response of the transmission path and using the error as the evaluated result.

10. The maximum likelihood sequence estimator as set forth in claim 9, wherein the error extracted by the transmission path quality evaluating means is an absolute value of the error of the estimated impulse response.

11. A maximum likelihood sequence estimator, comprising:

transmission path estimating means for estimating an impulse response of a transmission path with a reception signal;

maximum likelihood sequence estimating means for estimating the maximum likelihood of a transmission symbol sequence of the reception signal with the impulse response of the transmission path estimated by said transmission path estimating means;

transmission path quality evaluating means for evaluating the quality of the transmission path; and soft decision value converting means for converting weighting of decoded data of the maximum likelihood estimated transmission symbol sequence based on a transmission encoding theory corresponding to an evaluated result received from said transmission path quality evaluating means and for outputting the resultant value as a soft decision value;

wherein said transmission path quality evaluating means is composed of envelope detecting means for detecting an envelope level of the reception signal and phase error extracting means for extracting an estimated phase error from an error of the estimated impulse response of the transmission line and is adapted for using the envelope level and the estimated phase error as the evaluated result.

12. A maximum likelihood sequence estimating method, comprising:
(a) obtaining an impulse response of a transmission path with a reception signal;
(b) estimating the maximum likelihood of a transmission symbol sequence of the reception signal with the impulse response of the transmission path;
(c) evaluating the quality of the transmission path so as to generate an evaluated value;
(d) decoding the maximum likelihood estimated transmission symbol sequence corresponding to a transmission encoding theory so as to generate data;
(e) converting the evaluated value corresponding to a value of the decoded data as a soft decision value; and
using an estimated phase error extracted from an error of the estimated impulse response of the transmission path as the evaluated value.

13. The maximum likelihood sequence estimator as set forth in claim 12, wherein the estimated phase error is extracted from an absolute value of the error of the estimated impulse response.

14. A maximum likelihood sequence estimating method, comprising:
(a) obtaining an impulse response of a transmission path with a reception signal;
(b) estimating the maximum likelihood of a transmission symbol sequence of the reception signal with the impulse response of the transmission path;
(c) evaluating the quality of the transmission path so as to generate an evaluated value;
(d) decoding the maximum likelihood estimated transmission symbol sequence corresponding to a transmission encoding theory so as to generate data;
(e) converting the evaluated value corresponding to a value of the decoded data as a soft decision value; and
using an error of the estimated impulse response of the transmission path as the evaluated value.

15. The maximum likelihood sequence estimator as set forth in claim 14, wherein the error of the estimated impulse response is an absolute value of the error of the estimated impulse response.

16. A maximum likelihood sequence estimating method, comprising:
(a) obtaining an impulse response of a transmission path with a reception signal;
(b) estimating the maximum likelihood of a transmission symbol sequence of the reception signal with the impulse response of the transmission path;
(c) evaluating the quality of the transmission path so as to generate an evaluated value;
(d) decoding the maximum likelihood estimated transmission symbol sequence corresponding to a transmission encoding theory so as to generate data;
(e) converting the evaluated value corresponding to a value of the decoded data as a soft decision value; and
using an envelope level of the reception signal and an estimated phase error extracted from an error of the estimated impulse response of the transmission path as the evaluated value.

17. A maximum likelihood sequence estimating method, comprising:
(a) obtaining an impulse response of a transmission path with a reception signal;
(b) estimating the maximum likelihood of a transmission symbol sequence of the reception signal with the impulse response of the transmission path;
(c) evaluating the quality of the transmission path so as to generate an evaluated value;
(d) decoding the maximum likelihood estimated transmission symbol sequence corresponding to a transmission encoding theory so as to generate data;
(e) using a value of which weighting of the decoded data has been converted corresponding to the evaluated value as a soft decision value; and
using an estimated phase error extracted from an error of the estimated impulse response of the transmission path as the evaluated value.

18. The maximum likelihood sequence estimator as set forth in claim 17, wherein the estimated phase error is extracted from an absolute value of the error of the estimated impulse response.

19. A maximum likelihood sequence estimating method, comprising:

(a) obtaining an impulse response of a transmission path with a reception signal;

(b) estimating the maximum likelihood of a transmission symbol sequence of the reception signal with the impulse response of the transmission path;

(c) evaluating the quality of the transmission path so as to generate an evaluated value;

(d) decoding the maximum likelihood estimated transmission symbol sequence corresponding to a transmission encoding theory so as to generate data;

(e) using a value of which weighting of the decoded data has been converted corresponding to the evaluated value as a soft decision value; and using an error of the estimated impulse response of the transmission path as the evaluated value.

20. The maximum likelihood sequence estimator as set forth in claim 19, wherein the error of the estimated impulse response is an absolute value of the error of the estimated impulse response.

21. A maximum likelihood sequence estimating method, comprising:

(a) obtaining an impulse response of a transmission path with a reception signal;

(b) estimating the maximum likelihood of a transmission symbol sequence of the reception signal with the impulse response of the transmission path;

(c) evaluating the quality of the transmission path so as to generate an evaluated value;

(d) decoding the maximum likelihood estimated transmission symbol sequence corresponding to a transmission encoding theory so as to generate data;

(e) using a value of which weighting of the decoded data has been converted corresponding to the evaluated value as a soft decision value; and using an envelope level of the reception signal and an estimated phase error extracted from an error of the estimated impulse response of the transmission path as the evaluated value.

* * * * *